(12) United States Patent
Land et al.

(10) Patent No.: US 9,024,530 B2
(45) Date of Patent: May 5, 2015

(54) SYNCHRONIZED AMBIENT LIGHT SENSOR AND DISPLAY

(71) Applicant: Apple Inc., Cupertino, CA (US)

(72) Inventors: Brian R. Land, Woodside, CA (US); Prashanth S. S. Holenarsipur, Fremont, CA (US); Terry Gilton, Cupertino, CA (US); Paul S. Drzaic, Morgan Hill, CA (US); Wei H. Yao, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 46 days.

(21) Appl. No.: 13/746,549

(22) Filed: Jan. 22, 2013

(65) Prior Publication Data

US 2014/0132158 A1 May 15, 2014

Related U.S. Application Data

(60) Provisional application No. 61/725,948, filed on Nov. 13, 2012.

(51) Int. Cl.
*H05B 39/04* (2006.01)
*H05B 41/36* (2006.01)
(Continued)

(52) U.S. Cl.
CPC .................. *H05B 37/02* (2013.01); *G09G 3/20* (2013.01); *G09G 3/3225* (2013.01);
(Continued)

(58) Field of Classification Search
CPC ............ H05B 33/0869; F21V 23/0442; G05B 11/017; G09G 2320/0276; G09G 2320/0626; G09G 2360/16

USPC ........................... 315/152; 345/690, 589, 207
See application file for complete search history.

(56) References Cited

U.S. PATENT DOCUMENTS 6,339,429 B1   1/2002   Schug
6,459,436 B1   10/2002  Kumada
(Continued)

FOREIGN PATENT DOCUMENTS

EP   1335430    8/2003
WO   00/41378   7/2000
(Continued)

OTHER PUBLICATIONS

"TC3404, TCS3414 Digital Color Sensors" Texas Advances Optoelectronic Solutions, TAOS137A, TAOS Inc., Apr. 2011.
(Continued)

*Primary Examiner* — Dylan White
(74) *Attorney, Agent, or Firm* — Treyz Law Group; G. Victor Treyz; Joseph F. Guihan

(57) ABSTRACT

An electronic device may be provided that has a display. The display may produce light using a backlight unit or using an array of light-emitting display pixels. An ambient light sensor may be mounted under an active area of the display to measure ambient light that is transmitted through the display. The display may be periodically disabled to prevent the display from producing light that interferes with the ambient light sensor. Display pixels may be coupled to a common cathode switch that can be periodically opened or the backlight in a display with a backlight can be periodically turned off. Control circuitry for periodically disabling the display while enabling the ambient light sensor may be implemented using a display driver integrated circuit mounted to a display.

19 Claims, 7 Drawing Sheets

(51) Int. Cl.
*G06F 3/038* (2013.01)
*G09G 5/00* (2006.01)
*H05B 37/02* (2006.01)
*G09G 3/20* (2006.01)
*G09G 3/32* (2006.01)
*G09G 3/34* (2006.01)

(52) U.S. Cl.
CPC ..... *G09G 3/3406* (2013.01); *G09G 2310/0237* (2013.01); *G09G 2320/0626* (2013.01); *G09G 2360/141* (2013.01); *G09G 2360/144* (2013.01)

(56) References Cited

U.S. PATENT DOCUMENTS

| | | | |
|---|---|---|---|
| 7,460,196 B2 | 12/2008 | Kim | |
| 7,825,891 B2 | 11/2010 | Yao et al. | |
| 7,960,682 B2 | 6/2011 | Gardner, Jr. | |
| 8,044,930 B2 | 10/2011 | Abileah et al. | |
| 8,068,125 B2 * | 11/2011 | Pantfoerder | 345/690 |
| 8,138,463 B2 | 3/2012 | Hadwen et al. | |
| 8,194,031 B2 | 6/2012 | Yao et al. | |
| 8,289,248 B2 | 10/2012 | Kunkel | |
| 8,384,003 B2 | 2/2013 | Gardner, Jr. | |
| 8,405,688 B2 * | 3/2013 | Pantfoerder | 345/690 |
| 2003/0189211 A1 | 10/2003 | Deitz | |
| 2003/0189586 A1 | 10/2003 | Vronay | |
| 2004/0036820 A1 | 2/2004 | Runolinna | |
| 2004/0095402 A1 | 5/2004 | Nakano | |
| 2005/0219197 A1 | 10/2005 | Pasqualini et al. | |
| 2007/0236485 A1 | 10/2007 | Trepte | |
| 2007/0279369 A1 | 12/2007 | Yao et al. | |
| 2008/0284716 A1 * | 11/2008 | Edwards et al. | 345/102 |
| 2009/0135115 A1 * | 5/2009 | Sakamoto et al. | 345/84 |
| 2009/0146928 A1 * | 6/2009 | Miyamoto et al. | 345/76 |
| 2009/0152445 A1 | 6/2009 | Gardner, Jr. | |
| 2010/0060562 A1 | 3/2010 | Hadwen et al. | |
| 2010/0079426 A1 | 4/2010 | Pance et al. | |
| 2011/0032285 A1 * | 2/2011 | Yao et al. | 345/690 |
| 2011/0043503 A1 | 2/2011 | Hadwen | |
| 2012/0051007 A1 * | 3/2012 | Alvarez et al. | 361/752 |
| 2012/0218239 A1 | 8/2012 | Yao et al. | |
| 2013/0106813 A1 * | 5/2013 | Hotelling et al. | 345/207 |

FOREIGN PATENT DOCUMENTS

| | | |
|---|---|---|
| WO | 02/37454 | 5/2002 |
| WO | 2007/069107 | 6/2007 |

OTHER PUBLICATIONS

Shedletsky et al., U.S. Appl. No. 13/731,966, filed Jan. 2, 2013.
Zheng, U.S. Appl. No. 13/738,908, filed Jan. 10, 2013.
Hotelling et al., U.S. Appl. No. 13/283,446, filed Oct. 27, 2011.
Shedletsky et al., U.S. Appl. No. 13/732,966, filed Jan. 2, 2013.
Jong et al., U.S. Appl. No. 13/686,746, filed Nov. 27, 2012.
Yin, U.S. Appl. No. 13/628,388, filed Sep. 27, 2012.
Gardner Jr., U.S. Appl. No. 13/771,779, filed Feb. 20, 2012.
Zheng, U.S. Appl. No. 13/678,349, filed Nov. 15, 2012.
Zheng et al., U.S. Appl. No. 13/241,034, filed Sep. 22, 2011.

* cited by examiner

SYNCHRONIZED AMBIENT LIGHT SENSOR AND DISPLAY

This application claims priority to U.S. provisional patent application No. 61/725,948 filed Nov. 13, 2012, which is hereby incorporated by reference herein in its entirety.

BACKGROUND

This relates generally to electronic devices and, more particularly, to electronic devices with displays and ambient light sensors.

Electronic devices often include displays. For example, portable devices such as cellular telephones and tablet computers are often provided with touch screen displays.

Ambient light sensors are sometimes provided in devices with displays to allow the devices to monitor ambient lighting conditions. A user of a portable device may often move between dim and bright lighting environments such as when transitioning between indoor and outdoor environments. Ambient light sensor readings may be taken in this type of device so that automatic display brightness adjustments may be made. When an increase in ambient light level is detected, control circuitry within the device may automatically increase the brightness of the display in the device to compensate for the additional glare and brightness associated with a bright ambient environment. This allows a user to view content on the display without interruption. Similarly, when a decrease in ambient light level is detected, the control circuitry within the device may automatically lower display brightness to a level that is appropriate for dim ambient lighting conditions.

Challenges arise when mounting ambient light sensors in an electronic device. In conventional devices, ambient light sensors are mounted under a window in an inactive display border region. The inactive display border region contains an opaque masking layer that hides internal components in the device from view by a user. The ambient light sensor window is formed from an opening in the opaque masking layer.

The need to provide sufficient space for mounting the ambient light sensor in alignment with the ambient light sensor window may consume more space within a device than desired. For example, this type of mounting arrangement may make the width of the inactive border region larger than desired. Although an opening could be formed in a device housing to accommodate the ambient light sensor, this type of mounting location may not always adequately measure ambient light levels in the vicinity of the display.

It would therefore be desirable to be able to provide improved ambient light monitoring schemes for electronic devices.

SUMMARY

An electronic device may be provided that has a display. The display may use a backlight unit to illuminate an array of display pixels or may have an array of light-emitting display pixels. An ambient light sensor may be mounted under an active portion of the display. The display may be sufficiently transparent to allow the ambient light sensor to make ambient light sensor measurements through the display.

The display may be periodically disabled to prevent the display from producing light that might interfere with the ambient light sensor. Display pixels may be coupled to a common cathode switch that can be periodically opened to disable the display or the light production by the display can be periodically interrupted by temporarily turning the backlight off. Control circuitry for periodically disabling the display while enabling the ambient light sensor so that the ambient light sensor acquires ambient light data may be implemented using a display driver integrated circuit mounted to the display.

Further features, their nature and various advantages will be more apparent from the accompanying drawings and the following detailed description of the preferred embodiments.

DETAILED DESCRIPTION

Figure 1:
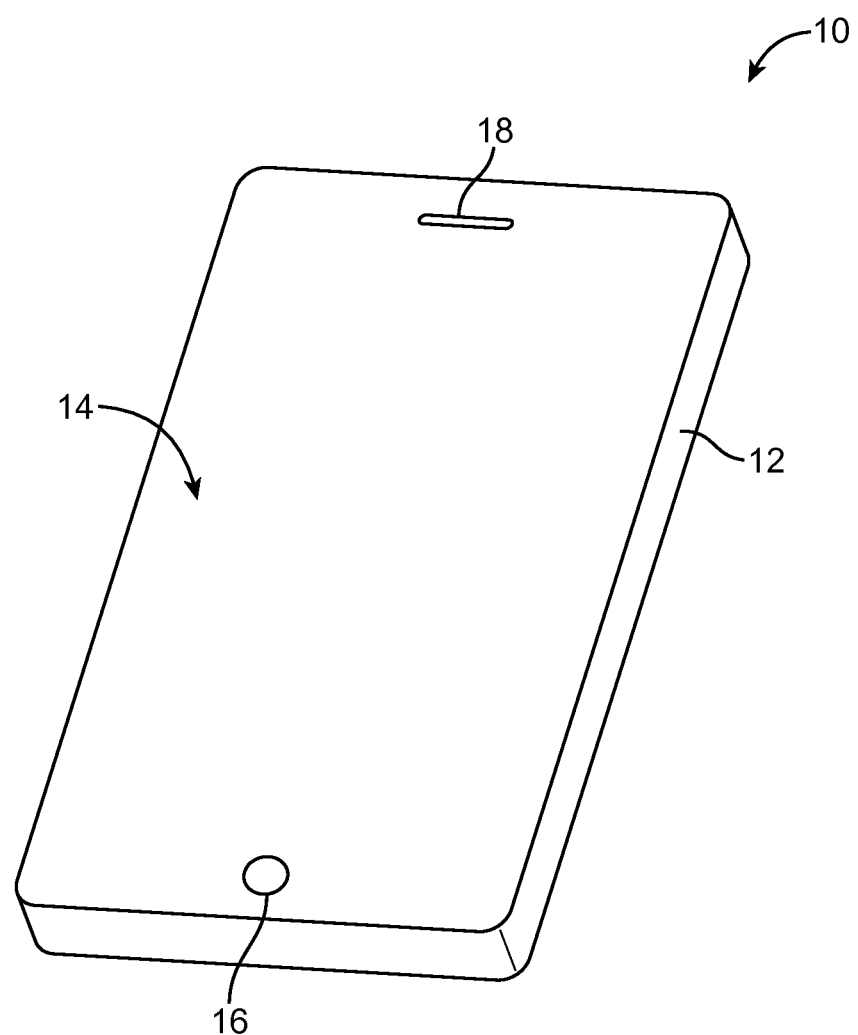
FIG. 1 is a perspective view of an illustrative electronic device of the type that may be provided with display and ambient light sensor structures in accordance with an embodiment of the present invention.

An illustrative electronic device that may be provided with a display and ambient light sensor circuitry is shown in FIG. 1. Electronic devices such as device 10 of FIG. 1 may be cellular telephones, media players, other handheld portable devices, somewhat smaller portable devices such as wristwatch devices, pendant devices, or other wearable or miniature devices, gaming equipment, tablet computers, notebook computers, desktop computers, televisions, computer monitors, computers integrated into computer displays, or other electronic equipment.

In the example of FIG. 1, device 10 includes a display such as display 14. Display 14 has been mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies. The brightness of display 14 may be adjustable. For example, display 14 may include a backlight unit formed from a light source such as a lamp or light-emitting diodes that can be used to increase or decrease display backlight levels and thereby adjust display brightness. Display 14 may also include organic light-emitting diode pixels or other pixels with adjustable intensities. In this type of display, display brightness can be adjusted by adjusting the intensities of drive signals used to control individual display pixels.

To prevent light that is produced by display 14 from interfering with the process of gathering ambient light sensor signals in device 10, the backlight unit or the individual light-producing display pixels in display 14 can be disabled whenever the ambient light sensor is enabled.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18.

In the center of display 14, display 14 may contain an array of active display pixels. This region is sometimes referred to as the active area of the display. A rectangular ring-shaped region surrounding the periphery of the active display region may not contain any active display pixels and may therefore sometimes be referred to as the inactive area of the display. The display cover layer or other display layers in display 14 may be provided with an opaque masking layer in the inactive region to hide internal components from view by a user.

Figure 2:
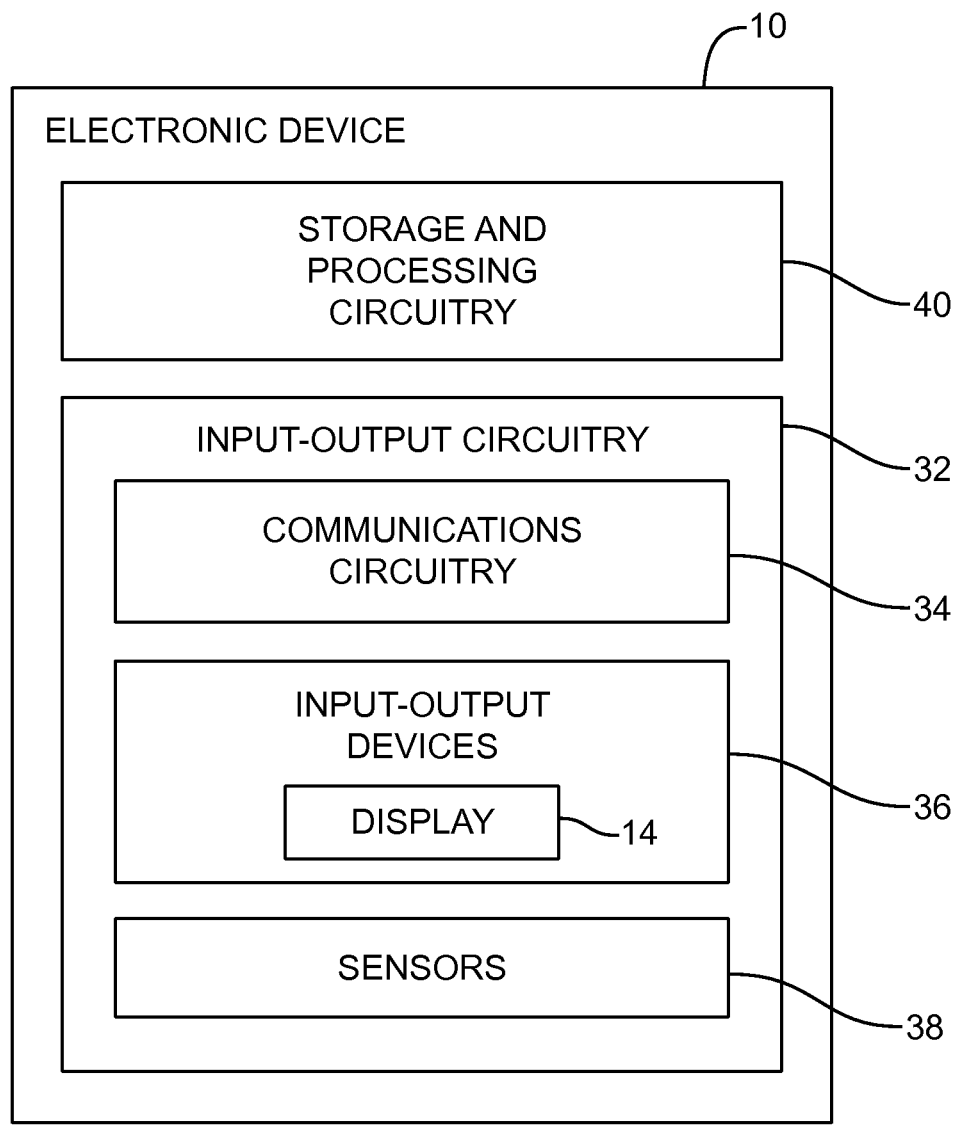
FIG. 2 is a schematic view of an illustrative electronic device of the type that may be provided with display and ambient light sensor structures in accordance with an embodiment of the present invention.

A schematic diagram of device 10 is shown in FIG. 2. As shown in FIG. 2, electronic device 10 may include control circuitry such as storage and processing circuitry 40. Storage and processing circuitry 40 may include one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 40 may be used in controlling the operation of device 10. The processing circuitry may be based on a processor such as a microprocessor and other suitable integrated circuits. With one suitable arrangement, storage and processing circuitry 40 may be used to run software on device 10 such as internet browsing applications, email applications, media playback applications, operating system functions, software for capturing and processing images, software implementing functions associated with gathering and processing sensor data, software that makes adjustments to display brightness and touch sensor functionality, etc.

Input-output circuitry 32 may be used to allow input to be supplied to device 10 from a user or external devices and to output to be provided from device 10 to the user or external devices.

Input-output circuitry 32 may include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Input-output circuitry 32 may include input-output devices 36 such as button 16 of FIG. 1, joysticks, click wheels, scrolling wheels, a touch screen such as display 14 of FIG. 1, other touch sensors such as track pads or touch-sensor-based buttons, vibrators, audio components such as microphones and speakers, image capture devices such as a camera module having an image sensor and a corresponding lens system, keyboards, status-indicator lights, tone generators, key pads, and other equipment for gathering input from a user or other external source and/or generating output for a user.

Sensor circuitry such as sensors 38 of FIG. 2 may include an ambient light sensor for gathering information on ambient light levels, proximity sensor components (e.g., light-based proximity sensors and/or proximity sensors based on other structures), accelerometers, gyroscopes, magnetic sensors, and other sensor structures.

Figure 3:
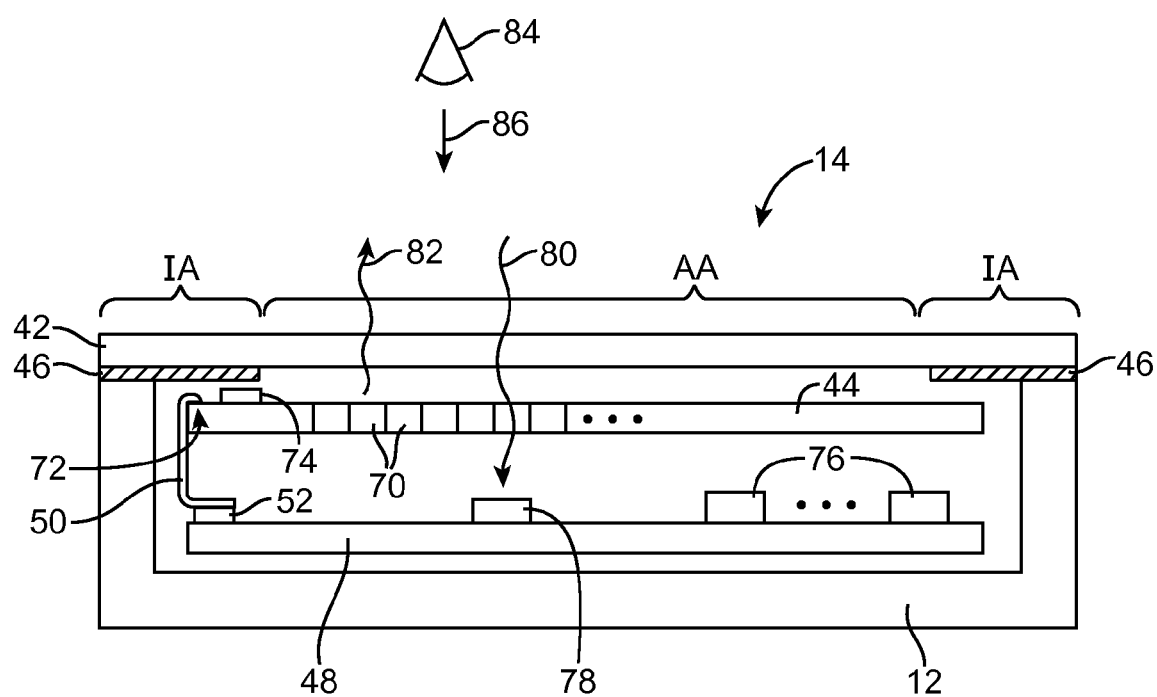
FIG. 3 is a cross-sectional side view of a portion of an electronic device having a display and ambient light sensor in accordance with an embodiment of the present invention.

A cross-sectional side view of electronic device 10 is shown in FIG. 3. As shown in FIG. 3, display 14 may be mounted in housing 12. Display structures 44 such as a liquid crystal display module, an organic light-emitting diode display layer, or other display structures that include an array of active display pixels 70 may be formed under active area AA of display cover layer 42. Display structures 44 may be formed from one or more display layers and may sometimes be referred to as display layers 44 or display 44. Display cover layer 42 may be formed from a clear glass layer, a layer of transparent plastic, or other cover layer material. A layer of ink (e.g., black ink or white ink or ink of other colors) such as opaque masking layer 46 may be formed on the underside of display cover layer 42 in inactive area IA.

During operation of display 44, light 82 from display pixels 70 (sometimes referred to as display pixel light 82 or display light 82) may be observed in active area AA of display 14 by a user such as viewer 84 who is viewing display 14 in direction 86.

Device 10 may contain one or more substrates such as substrate 48. Components 76 may be mounted on substrate 48. Components 76 may include integrated circuits and other circuitry such as circuitry 32 and 40 of FIG. 2. To make ambient light measurements, device 10 may include one or more ambient light sensors such as ambient light sensor 78. Display 44 is preferably at least somewhat transparent to ambient light 80 (e.g., display 44 may be less than 1% or more than 1% transparent, may be less than 0.5% transparent, may be less than 0.25% transparent, etc.). As shown in FIG. 3, ambient light sensor 78 may be mounted on substrate 48 under active area AA of display 44, so that ambient light 80 is received through display 44.

Substrate 48 may be a dielectric carrier such as a molded plastic carrier or may be a printed circuit. For example, substrate 48 may be a printed circuit such as a rigid printed circuit board formed from a dielectric material such as fiberglass-filled epoxy or may be a flexible printed circuit formed from a dielectric layer such as a sheet of polyimide or other flexible polymer layer. Metal interconnect paths may be provided on substrate 48 to allow substrate 48 to covey signals between components.

Substrate 48 may be coupled to additional substrates in device 10 such as printed circuit 50 using connectors such as connector 52 (e.g., a board-to-board connector or other connection structures). Substrate 50 may be, for example, a flexible printed circuit cable that is attached to display 44 at connection 72 (e.g., using conductive adhesive contacts such as anisotropic conductive film contacts, using connectors, using welds, using solder joints, etc.).

One or more circuits such as display driver integrated circuit 74 may be coupled to display 44 using flexible printed circuits or by mounting such circuits on display 44 as shown in FIG. 3. Display driver circuitry such as circuitry 74 may also be partly or fully mounted on other substrates such as substrate 48.

Display driver circuitry may receive information from a processor or other circuitry (e.g., one or more integrated circuits 76 mounted on substrate 48) via path 50 and may convert this information into display pixel control signals for controlling the array of display pixels in display 14.

Figure 4:
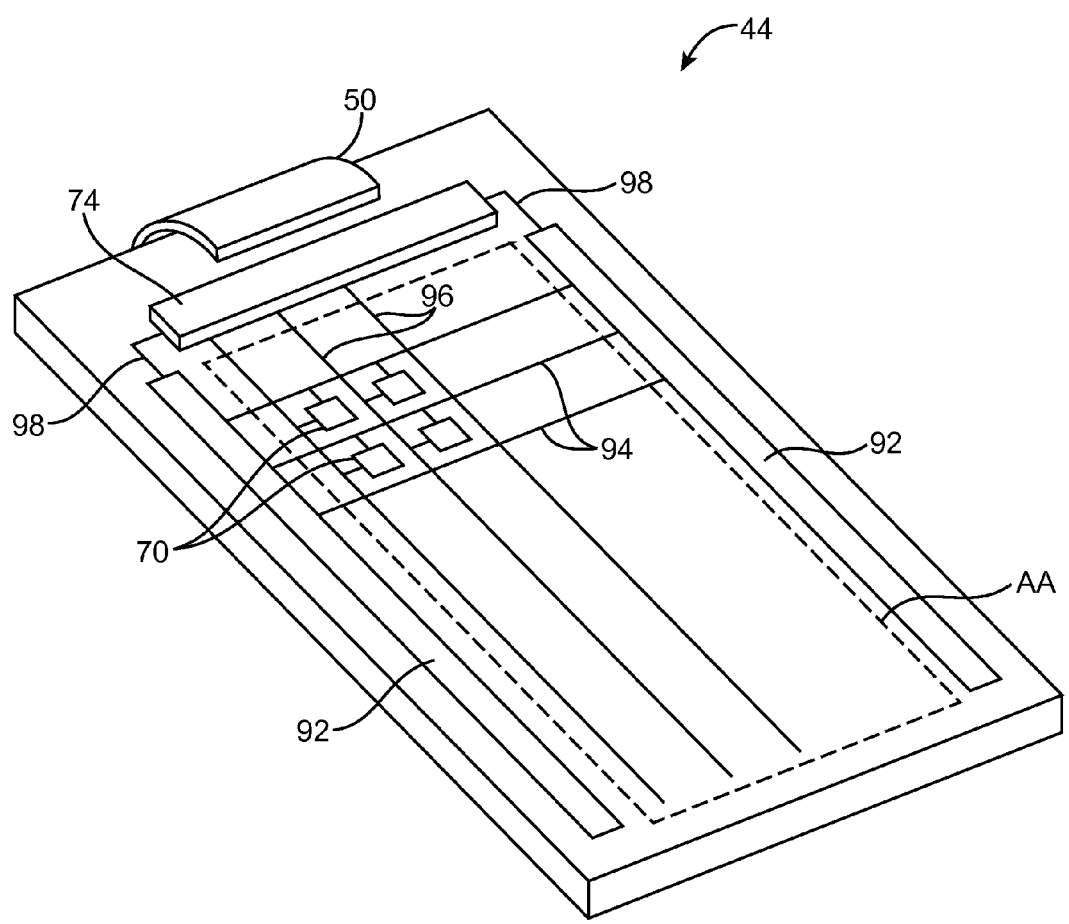
FIG. 4 is a perspective view of a display having rows and columns of display pixels in accordance with an embodiment of the present invention.

A perspective view of display structures 44 in a configuration in which display pixels 70 have been arranged in a rectangular array having rows and columns is shown in FIG. 4. Display structures 44 of FIG. 4 may be organic light-emitting diode display structures, liquid crystal display structures, display structures associated with other types of display such as an electrophoretic display, an electrowetting display, a plasma display, or other types of display structures. For example, display structures 44 may be a top emission or bottom emission organic light-emitting diode display and display pixels 70 may each contain an organic light-emitting diode.

As shown in FIG. 4, information to be displayed on display 44 may be received from control circuitry 40 (FIG. 2) via path 50. Path 50 may also be used to convey signals to control circuitry 40 (e.g., components 76 on board 48). Path 50 may be implemented using a structure such as a flexible printed circuit cable.

The information that is to be displayed on display 44 may include text, still images, and video. Display driver integrated circuit 74 may convert the information that is received over path 50 into data signals D that are driven onto corresponding date lines 96. Display driver integrated circuit 74 and gate driver circuitry 92 may also provide gate control signals G on gate lines 94.

Gate driver circuitry 92 may be implemented as part of display driver circuitry 74 or may be formed as separate thin-film transistor circuitry on a glass substrate layer in display 44 as shown in FIG. 4. As an example, gate driver circuitry 92 may be formed from polysilicon or amorphous silicon thin-film transistors. During operation, display driver circuitry 74 may provide control signals (e.g., clock signals, etc.) to gate driver circuits 92 via paths such as path 98. Gate driver circuits 92 may, in turn, assert gate control signals G on gate lines 94 to sequentially load data from data lines D into the rows of display pixels 70 in display 44.

In the example of FIG. 4, there is one gate driver circuit 92 on the left edge of the array of display pixels 70 and another gate driver circuit 92 on the right edge of the array of display pixels 70. This is merely illustrative. If desired, gate driver circuitry 92 may run along one edge of display 44 and gate lines 94 may extend from that edge of the display across the array of display pixels 70.

Gate driver circuitry 92 typically asserts gate line signals G on gate lines 94 in sequence (e.g., asserting a signal on gate line N while deasserting all other gate line signals, subsequently asserting gate control signal G on gate line N+1 while deasserting the gate control signal G on gate line N and the other gate lines, etc.). A sequence in which all gate line signals G have been successively asserted from the $0^{th}$ row to the last row in display 44 is sometimes referred to as a frame of display data. Frames may be displayed at any suitable frequency (e.g., 50 Hz, 60 Hz, 62 Hz, 120 Hz, more than 60 Hz, less than 60 Hz, etc.).

The circuitry used in each display pixel 70 may depend on the type of display technology used in forming display 44. For example, in a liquid crystal display, each display pixel 70 may contain electrodes for applying an electric field to an associated portion of a layer of liquid crystal material. A thin-film transistor may be provided in each display pixel 70 in this type of arrangement to load display data D into a storage capacitor within the display pixel. Storage capacitors and thin-film transistors may also be used in controlling the operation of an organic light-emitting diode display and other displays.

The storage capacitor in each display pixel may be used to retain the loaded data bit for that display pixel between successive frames. For example, the storage capacitor in a data pixel in row M may have a size sufficient to allow the storage capacitor to retain loaded data while gate driver circuitry 92 is used to load data into lines M+1 to K (where K is the number of rows in display 44) and while gate driver circuitry 92 is used to load data into lines 0 to M−1 before returning to line M.

Figure 5:
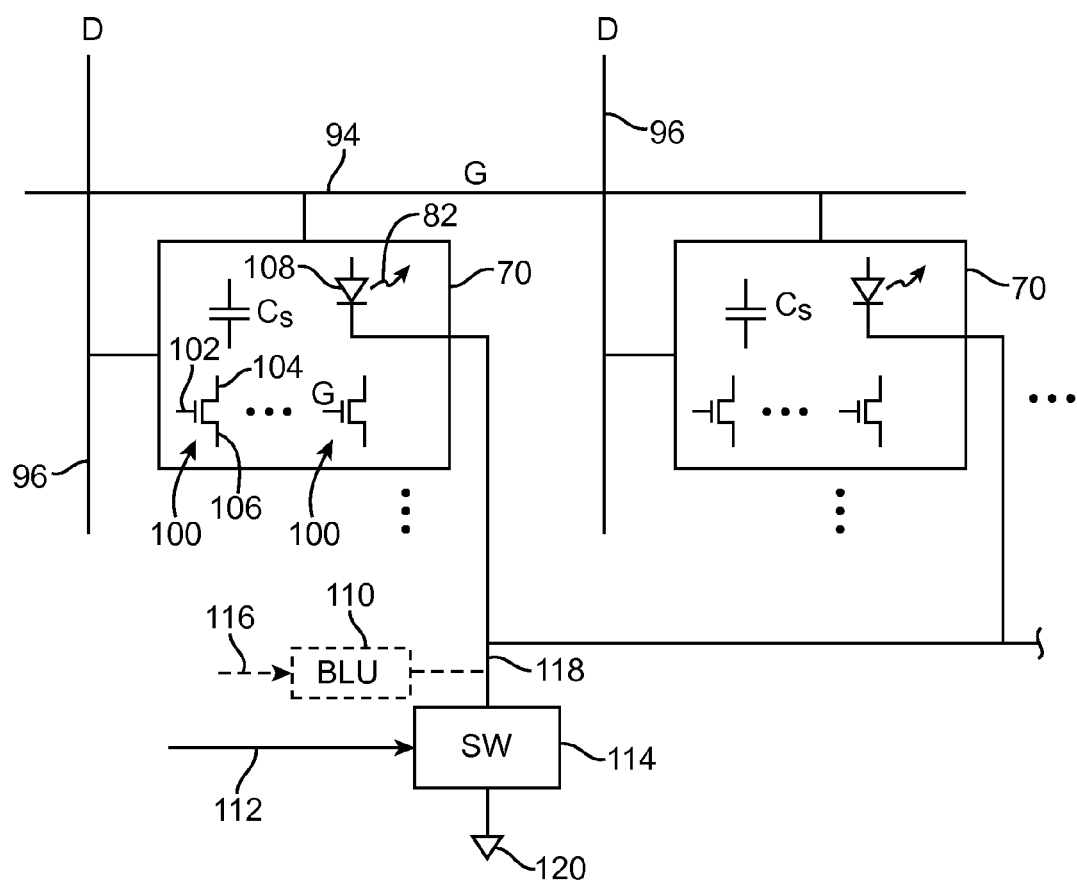
FIG. 5 is a circuit diagram of an array of display pixels in accordance with an embodiment of the present invention.

A circuit diagram of a portion of an array of display pixels 70 in display 44 is shown in FIG. 5. As shown in FIG. 5, each display pixel 70 may, if desired, include a storage element such as storage capacitor Cs. Each display pixel 70 may also contain one or more control devices such as thin-film transistors 100. Each transistor 100 may have a gate such a gate 102, a drain such as drain 104, and a source such as source 106. Terminals such as source terminal 106 and drain terminal 104 may sometimes be referred to collectively as source-drain terminals. Gate lines 94 may be coupled to gate terminals such as gate terminal 102 of FIG. 5 to control the operation of transistor 100.

In displays such as organic light-emitting diode displays, display pixels 70 may each contain a light-emitting diode such as light-emitting diode 108 of FIG. 5. Each light emitting diode 108 may emit a respective pixel of light 82. A shared power terminal such as common cathode terminal 118 may be used to supply a ground voltage from terminal 120 (or other suitable power signal) to all light-emitting diodes 108 in display 14 in parallel. Control signals on the gate lines and data lines may be used in determining how strongly each light-emitting diode 108 is driven. This allows control circuitry 40 to increase and decrease the brightness of display 14 in response to ambient light sensor signals from ambient light sensor 78.

Switching circuitry such as switch 114 may be interposed in the power supply path between display pixels (and light-emitting diodes 108) and common power supply terminal 120. Switch 114 may receive control signals on input 112 from control circuitry in device 10 such as display driver circuitry 74. The control signals on input 112 may be used to open and close switch 114. For example, switch 114 may be closed during time periods in which it is desired to enable display 44 and thereby allow pixels 70 to be driven to display images to viewer 84. Switch 114 may be opened during time periods in which it is desired to temporarily disable display 44 by cutting off power to light-emitting diodes 108 in pixels 70. As an example, switch 114 may be opened when it is desired to turn off display 44 for sufficiently long to allow ambient light sensor 78 to receive ambient light 80 without interference from display light 82.

In displays such as liquid crystal displays, display backlight may be provided from a backlight unit such as backlight unit 110 of FIG. 5. Backlight unit 110 may contain a light guide plate or other optical structures that distribute the backlight to display 44 from an array of light-emitting diodes or other light source. In configurations for display 14 in which backlight unit 110 is used to provide backlight for display 44, ambient light sensor 78 may be located between backlight unit 110 and display 44 or may be integrated into one of the structures of display 44 (e.g., by forming ambient light sensor 78 as a thin-film layer on a substrate or by mounting ambient light sensor 78 to a substrate).

Both in configurations in which ambient light is gathered by ambient light sensor 78 without passing directly through all of the layers of display 44 and in which ambient light is gathered by ambient light sensor 78 after being transmitted through display 44, it may be helpful to temporarily disable display 44 while enabling ambient light sensor 78 to prevent the light that is produced by display 44 from interfering with the operation of ambient light sensor 78.

Control signals on control input 116 may be used to control the operation of backlight unit 110 and thereby control the brightness of the backlight for display 44 (e.g., using signals that are modulated using pulse width modulating schemes or other suitable control schemes). At the same time that the backlight strength of backlight unit 110 is being adjusted, signals on the gate lines and data lines in display 44 may be used to create images from the display pixels 70 in display 44.

The control signals on input 116 may be used to enable or disable light production for display 44. For example, the control signals on input 116 may be used to enable display 44 and adjust the brightness of display 44 when it is desired to display images on display 44 for viewer 84. The control signals on input 116 may also be used to periodically disable display 44. For example, control signals on input 116 may be used to temporarily turn off display 44 (i.e., the backlight in display 44) for sufficiently long to allow ambient light sensor 78 to receive ambient light 80 without interference from display backlight (e.g., display light 82 that is passing through pixels 70).

Figure 6:
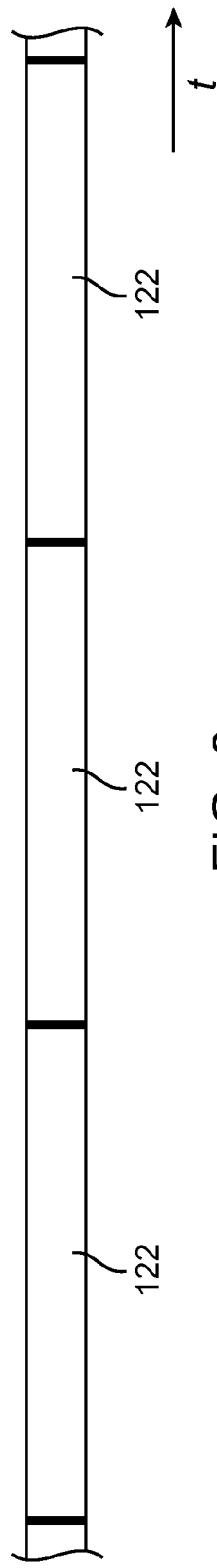
FIG. 6 is a timing diagram showing how a display may be presented with frames of data when an ambient light sensor is not being actively used in accordance with an embodiment of the present invention.

FIG. 6 is a timing diagram showing how display 14 may be provided with display data in frames 122. During each frame, display data D is driven onto data lines 96 by display driver circuitry 74 while successive gate line signals G on gate lines 94 are asserted to load the data into successive rows of display pixels 70 (e.g., to load the data bits for the image that is to be displayed onto the storage capacitors Cs of display pixels 70). After a full frame of data has been loaded, the data loading process may repeat (i.e., display driver circuitry 74 may load another frame 122 of data into the storage capacitors of the array of display pixels in display 44). The length of each frame 122 may be about 5-20 ms or other suitable duration, depending on the frame rate of display 14. For example, when display 14 has a frame rate of 62 Hz, each frame 122 will have a duration of about 16 ms.

It may be desirable to adjust display brightness automatically based on ambient light sensor readings. For example, it may be desirable for device 10 to automatically increase display brightness when brighter conditions are detected such as when a user carries electronic device 10 from a dim indoor environment into a brighter outdoor environment and it may be desirable for device 10 to automatically decrease display brightness when dimmer conditions are detected such as when a user carries electronic device 10 from a bright outdoor environment into dimmer indoor conditions.

When automatic real time adjustments to display brightness are desired, the frame-by-frame data loading process of FIG. 6 may be modified to prevent display light that is generated by the display from interfering with the ability of ambient light sensor 78 to monitor how much ambient light is present in the vicinity of display 14. If display brightness is not adjusted during ambient light signal acquisition, there is a potential that ambient light reading accuracy will be degraded or that ambient light signals cannot be successfully acquired due to the presence of interfering display light.

Figure 7:
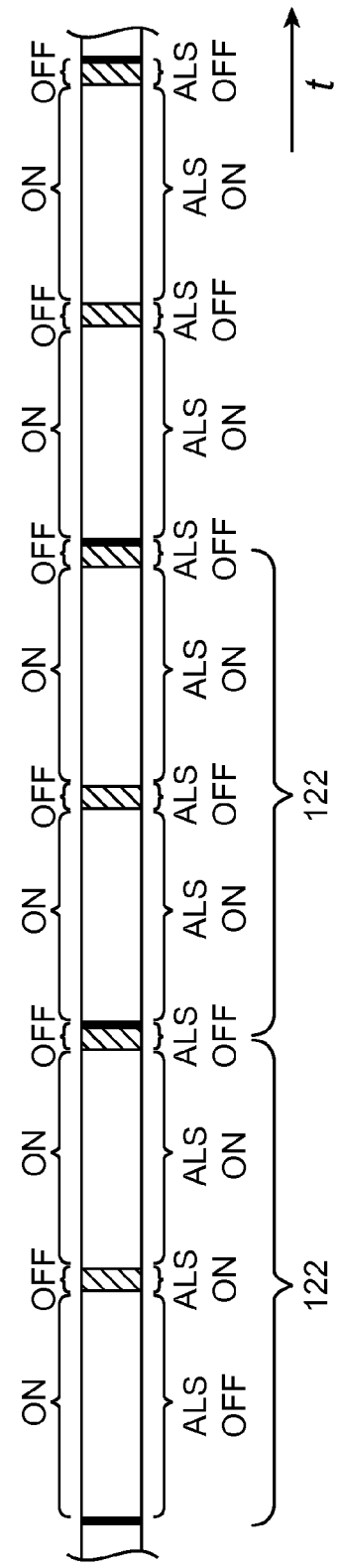
FIG. 7 is a timing diagram showing how a common cathode or other display circuit may be used to periodically turn off a display while synchronously enabling an ambient light sensor so that the ambient light sensor can gather ambient light readings through the display without interference from light produced by the display in accordance with an embodiment of the present invention.

FIG. 7 is a timing diagram showing how display 14 may be periodically disabled to allow ambient light sensor data to be gathered by ambient light sensor 78 without being affected by display light (e.g., display pixel light produced when illuminating display pixels 70 with backlight from backlight unit 110 or display pixel light produced by the display pixels of light-emitting diodes 108). As shown in FIG. 7, data may be provided to display 44 in frames 122. Each frame may have a duration of about 5-20 ms or other suitable duration, as determined by the frame rate of display 14. If, for example, display 14 has a frame rate of 62 Hz, each frame 122 will have a length of about 16 ms.

Control circuitry in device 10 such as display driver 74 may issue periodic control signals that are used as display disable signals and ambient light sensor enable signals. As shown in FIG. 7, for example, display 44 may be turned on while ambient light sensor 78 is turned off and display 44 may be turned off when ambient light sensor 78 is turned on. In an illustrative configuration in which each frame 122 has a period of 16 ms, it may be desirable to turn ambient light sensor 78 on (and display 44 off) for two 1 ms intervals and to turn ambient light sensor 78 off (and display 44 on) for two 7 ms intervals during each frame. The on and off periods of ambient light sensor 78 (and display 44) may alternate. In the illustrative configuration in which ambient light sensor 78 is on for 1 ms and off for 7 ms, the active duty cycle of ambient light sensor 78 will be ⅛ (i.e., 12.5%). In general, the ambient light sensor active duty cycle may be 1-99%, 5-80%, more than 4%, less than 70%, less than 50%, less than 40%, less than 30%, less than 20%, more than 10%, 10-45%, or other suitable amount.

In scenarios in which display 44 is off for only brief periods of time (e.g., 1 ms at a time or other suitable short interval associated with relatively smaller active ambient light sensor duty cycles), viewer 84 will not be able to perceive any significant dimming or flickering of display 14. At the same time, ambient light sensor 78 may be able to acquire sufficient data during the display "OFF" intervals. In devices with backlight units 110, backlight 110 may be turned off in the "OFF" intervals by sending the display control signal to input 116 of backlight unit 110 (FIG. 5). The backlight "OFF" intervals may correspond to off times applied as part of a pulse width modulation power control scheme for the backlight or may be asynchronous with respect to any backlight power pulse width modulation signals that are supplied to the backlight unit. In devices with organic light-emitting diode displays or other displays having pixel-sized light sources such as light-emitting diodes 108, control circuitry such as common cathode switch 114 may be provided with a control signal on input 112 that temporarily disables the display during the "OFF" intervals.

Figure 8:
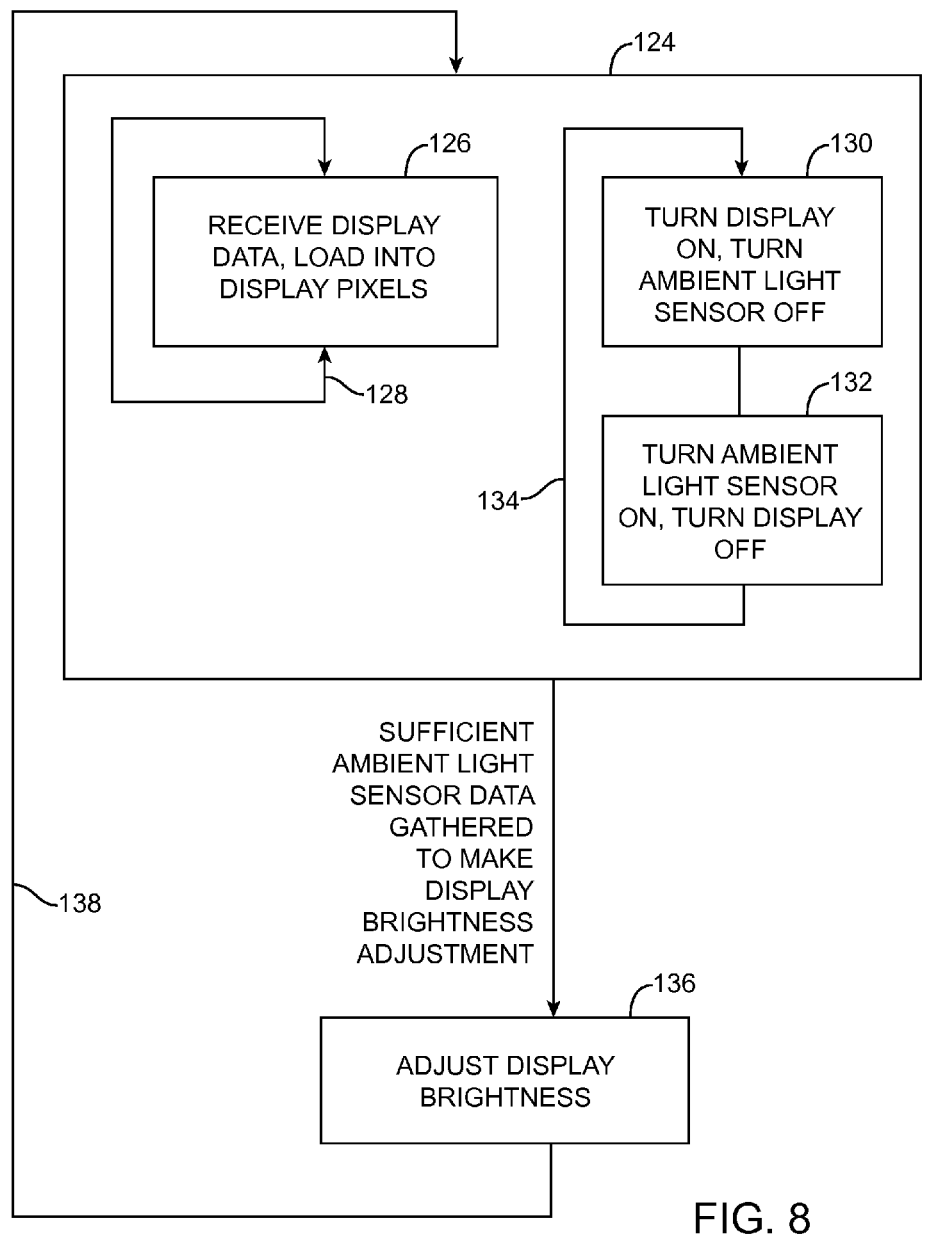
FIG. 8 is a flow chart of illustrative steps involved in operating an electronic device having an ambient light sensor that gathers ambient light sensor readings through a display in accordance with an embodiment of the present invention.

Illustrative steps involved in controlling display 14 so that ambient light sensor 78 can make ambient light sensor measurements without interference from light from display 14 and thereby allow device 10 to make screen brightness adjustments or other take other suitable actions are shown in FIG. 8. During the operations of step 124, device 10 may provide display 14 with display data while periodically disabling the production of light by display 14 so that ambient light sensor data can be acquired without interference from the light of display 14. In particular, control circuitry 40 may, during the operations of step 126, provide display data to display driver circuitry 74 over path 50 so that display driver circuitry 74 may load the display data into storage capacitors Cs in display pixels 70 (e.g., using gate driver circuitry 92, data lines 96, and gate lines 94). The display data loading process may be performed continuously over a series of frames, as indicated by line 128.

While display data is being loaded into display pixels 70 by display driver circuitry 74, display driver circuitry 74 may produce display light and ambient light sensor control signals (sometimes referred to as display enable/disable signals and/or ambient light sensor disable/enable signals). The control signals may be provided to ambient light sensor 78 over path 50 and to display circuitry such as control line 116 of FIG. 5 or control line 112 of FIG. 5. In particular, a control signal may be provided to display 44 and ambient light sensor 78 (e.g., for a duration of 7 ms) that enables display 44 (i.e., that allows display 44 to produce light) while disabling ambient light sensor 78 (step 130), followed by a control signal (e.g., for 1 ms) that disables display 44 (to temporarily prevent display 44 from producing light) while enabling ambient light sensor 78. As indicated by line 134, the operations of steps 130 and 134 may be performed continuously, while display 14 is being continuously loaded with data during the operations of step 126.

Ambient light sensor 78 may include photodetector structures for converting incoming ambient light from artificial lighting or the sun into electrical signals. Ambient light sensor 78 or associated control circuitry may digitize the electrical signals to produce digital ambient light sensor data. Digital filtering and other signal processing techniques may be applied to the digital ambient light sensor data, if desired. Periodically (e.g., according to a schedule or whenever sufficient data has been gathered), control circuitry 40 may adjust the brightness of display 14 (step 136). Processing may continuously loop through steps 124 and 136, as indicated by line 138.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
a display;
an ambient light sensor mounted under the display that receives ambient light through the display; and
control circuitry that periodically disables the display while enabling the ambient light sensor so that the ambient light sensor gathers ambient light sensor data without interference from light from the display, wherein the ambient light sensor exhibits an active duty cycle of less than 20%.

2. The electronic device defined in claim 1 wherein the display includes an array of display pixels each of which has a light-emitting diode and wherein the control circuitry is configured to periodically disable the light-emitting diodes.

3. The electronic device defined in claim 2 wherein the light-emitting diodes are coupled to a common switch and wherein the switch is periodically closed to enable the light-emitting diodes and is periodically opened to disable the light-emitting diodes.

4. The electronic device defined in claim 3 wherein the light-emitting diodes are organic light-emitting diodes.

5. The electronic device defined in claim 4 wherein the control circuitry includes a display driver integrated circuit that periodically enables the ambient light sensor while producing display disable signals that open the switch to disable the light-emitting diodes.

6. The electronic device defined in claim 1 wherein the display comprises a backlight unit and wherein the control circuitry is configured to provide a control signal that turns off the backlight unit while turning on the ambient light sensor.

7. The electronic device defined in claim 6 wherein the display comprises a liquid crystal display.

8. The electronic device defined in claim 1 wherein the control circuitry is configured to adjust display brightness for the display in response to data from the ambient light sensor.

9. An electronic device, comprising:
a display;
an ambient light sensor mounted under the display that receives ambient light through the display;
control circuitry that periodically disables the display while enabling the ambient light sensor so that the ambient light sensor gathers ambient light sensor data without interference from light from the display;
a housing in which the display is mounted; and
a display cover layer, wherein the display cover layer has a clear central portion that covers an active area of the display, wherein the display cover layer has an opaque inactive border region with an opaque masking layer that surrounds the clear central portion, and wherein the ambient light sensor is mounted under the active area of the display.

10. Apparatus, comprising:
a display having an array of display pixels that each contain a light-emitting diode;
a switch configured to provide power to the light-emitting diodes when closed and to interrupt power to the light-emitting diodes when open;
an ambient light sensor that measures ambient light that is transmitted through the array of display pixels; and
control circuitry that directs the switch to periodically interrupt power to the light-emitting diodes while using the ambient light sensor to measure the ambient light.

11. The apparatus defined in claim 10 wherein the control circuitry includes a display driver integrated circuit that provides a periodic control signal to the switch to periodically interrupt the power to the light-emitting diodes.

12. The apparatus defined in claim 11 wherein the light emitting diodes comprise organic light-emitting diodes.

13. The apparatus defined in claim 12 wherein the periodic control signal periodically enables the ambient light sensor so that the ambient light sensor exhibits an active duty cycle of less than 20%.

14. An electronic device, comprising:
a housing;
a display mounted in the housing;
an ambient light sensor that is mounted under an active area of the display and that receives ambient light through the display; and
display driver circuitry that periodically directs the display not to produce light while directing the ambient light sensor to measure the ambient light received through the display, wherein the display driver circuitry is configured to alternately enable and disable the ambient light sensor.

15. The electronic device defined in claim 14 wherein the display driver circuitry comprises a display driver integrated circuit mounted on the display.

16. The electronic device defined in claim 14 wherein the display comprises an array of organic light-emitting diode display pixels.

17. The electronic device defined in claim 14 wherein that the ambient light sensor exhibits an active duty cycle of less than 20%.

18. The electronic device defined in claim 14 wherein the display driver circuitry is attached to the display and wherein the ambient light sensor is mounted on a printed circuit.

19. The electronic device defined in claim 18 further comprising a flexible printed circuit that couples the display driver circuitry on the display with the ambient light sensor on the printed circuit.

\* \* \* \* \*